United States Patent

(12) United States Patent
Cooke

(10) Patent No.: US 11,694,709 B2
(45) Date of Patent: Jul. 4, 2023

(54) AUDIO SIGNAL

(71) Applicant: Please Hold (UK) Limited, Manchester (GB)

(72) Inventor: Michael Cooke, Manchester (GB)

(73) Assignee: PLEASE HOLD (UK) LIMITED, Manchester (GB)

( * ) Notice: Subject to any disclaimer, the term of this patent is extended or adjusted under 35 U.S.C. 154(b) by 390 days.

(21) Appl. No.: 16/757,304

(22) PCT Filed: Oct. 19, 2018

(86) PCT No.: PCT/GB2018/053041
§ 371 (c)(1),
(2) Date: Apr. 17, 2020

(87) PCT Pub. No.: WO2019/077373
PCT Pub. Date: Apr. 25, 2019

(65) Prior Publication Data
US 2021/0158833 A1    May 27, 2021

(30) Foreign Application Priority Data
Oct. 20, 2017   (GB) ..................... 1717281

(51) Int. Cl.
*G10L 21/0364* (2013.01)
*G10L 21/034* (2013.01)
*H03G 3/30* (2006.01)

(52) U.S. Cl.
CPC ........ *G10L 21/0364* (2013.01); *G10L 21/034* (2013.01); *H03G 3/3005* (2013.01)

(58) Field of Classification Search
None
See application file for complete search history.

(56) References Cited

U.S. PATENT DOCUMENTS 6,671,669 B1   12/2003   Garidadr
8,355,514 B2   1/2013   Rhoads
(Continued)

FOREIGN PATENT DOCUMENTS

EP   2858382 A1   4/2015
GB   2520048 A    5/2015
(Continued)

OTHER PUBLICATIONS

Noise gate; Wikipedia; pp. all; Jun. 27, 2017 (Year: 2017).*
Search and Examination Report for Application No. GB1717279.2 dated Apr. 20, 2018.
(Continued)

*Primary Examiner* — Richa Mishra
(74) *Attorney, Agent, or Firm* — Hamilton, Brook, Smith & Reynolds, P.C.

(57) ABSTRACT

A computer device (100) for processing audio signals is described. The computer device (100) includes at least a processor and a memory. The computer device (100) is configured to receive a bitstream comprising a combined audio signal, the combined audio signal comprising a first audio signal including speech and a second audio signal. The computer device (100) is configured to compress the combined audio signal to provide a compressed audio signal. The computer device (100) is configured to control a dynamic range of the compressed audio signal to provide an output audio signal. In this way, a quality of the speech included in the output audio signal is improved.

17 Claims, 11 Drawing Sheets

(56) References Cited

U.S. PATENT DOCUMENTS

| | | |
|---|---|---|
| 9,471,698 B1 | 10/2016 | Liu |
| 10,249,289 B2 | 4/2019 | Chun et al. |
| 2006/0200344 A1 | 9/2006 | Kosek |
| 2006/0247922 A1 | 11/2006 | Hetherington et al. |
| 2010/0106507 A1* | 4/2010 | Muesch ............... H04R 25/356 |
| | | 704/270.1 |
| 2011/0040567 A1* | 2/2011 | Oh ....................... G10L 19/008 |
| | | 704/500 |
| 2011/0257974 A1 | 10/2011 | Krisjansson |
| 2013/0151242 A1 | 6/2013 | Kim |
| 2014/0108252 A1 | 4/2014 | Itwaru |
| 2016/0335043 A1 | 11/2016 | Guyott et al. |
| 2017/0251308 A1 | 8/2017 | Cook |
| 2017/0339496 A1* | 11/2017 | Epstein ................ H04R 25/505 |
| 2018/0096677 A1 | 4/2018 | Pollet et al. |
| 2020/0065262 A1* | 2/2020 | Bellorado .......... G11B 5/59666 |
| 2020/0302258 A1 | 9/2020 | Lafferty |

FOREIGN PATENT DOCUMENTS

| | | |
|---|---|---|
| GB | 2566760 B | 10/2019 |
| WO | 2014059520 A1 | 4/2014 |

OTHER PUBLICATIONS

International Search Report and Written Opinion for Application No. PCT/GB2018/053042, titled: IDENTIFIER, dated Nov. 30, 2018.

Combined Search and Examination Report under Sections 17 and 18(3) for GB Application No. 1717281.8, entitled "Audio Signal," dated Apr. 18, 2018.

International Search Report for International Application No. PCT/GB2018/053041, entitled Audio Signal, dated Nov. 27, 2018.

"Noise gate," Wikepedia , retrieved from the Internet: URL: https://en.wikipedia.org/w/index.php?title=Noise_gate&oldid=787373360 [retrieved on Nov. 19, 2018] pp. 1-5 (Jun. 25, 2017).

\* cited by examiner

AUDIO SIGNAL

This application is the U.S. National Stage of International Application No. PCT/GB2018/053041, filed Oct. 19, 2018, which designates the U.S., and claims priority under 35 U.S.C. § 119 or 365(c) to Great Britain Application No. 1717281.8, filed Oct. 20, 2017. The entire teachings of the above applications are incorporated herein by reference.

BACKGROUND

Technical Field

The present invention relates generally to the field of audio signals. More particularly, the present invention relates to a computer device for and a method of processing an audio signal and an audio signal, for example for transmission via a telephony service.

Related Art

Sound quality is typically an assessment of accuracy, enjoyability, or intelligibility of audio output from an electronic device, such as a telephone. Sound quality may be measured objectively, thereby determining the accuracy with which the electronic device reproduces an original audio input. Additionally and/or alternatively, sound quality may be measured subjectively, thereby determining the intelligibility of the audio output to a human listener. In speech communication, intelligibility (also known as clarity) is a measure of how comprehensible speech is in given conditions. Intelligibility may be affected by a level of the audio output, the sound quality of the speech, a type and/or a level of background noise, reverberation, properties of the electronic device and/or properties of a communication system via which the audio is communicated.

There is a particular problem when a speech signal is combined, directly or indirectly, with another audio signal. For example, transmitted telephone audio, broadcast radio and/or broadcast television audio may include speech, music and/or other speech. In such cases, intelligibility of the speech may be adversely affected.

The example embodiments have been provided with a view to addressing at least some of the difficulties that are encountered in processing of audio signals, whether those difficulties have been specifically mentioned above or will otherwise be appreciated from the discussion herein.

SUMMARY

According to the present invention there is provided a computer device, a method, an audio signal and a computer-readable storage medium as set forth in the appended claims. Additional features of the invention will be apparent from the dependent claims, and the description herein.

There now follows a summary of various aspects and advantages according to embodiments of the invention. This summary is provided as an introduction to assist those skilled in the art to more rapidly assimilate the detailed discussion herein and is not intended in any way to limit the scope of the claims that are appended hereto.

In general, there is described a computer device for and a method of processing audio signals whereby a quality of speech included in output audio signals is improved. By processing a combined audio signal, comprising a first audio signal including speech and a second audio signal, by compressing the combined audio signal and controlling a dynamic range of the compressed audio signal, an output audio signal thus processed has an improved quality of speech. Particularly, an intelligibility of the speech included in the output audio signal is improved compared with that of the unprocessed (or input) combined audio signal. In this way, a human listener may better comprehend the speech included in the output audio signal. The improved quality of speech may be especially beneficial if the output audio signal is communicated via a communication system having a limited frequency bandwidth, for example a telephony system, and/or if a human listener thereof has a limited hearing range and/or uses a hearing aid. Additionally and/or alternatively, the improved quality of speech may be especially beneficial if the first audio signal and/or the second audio signal includes music.

In one example, there is provided a computer device for processing audio signals, the computer device including at least a processor and a memory, wherein the computer device is configured to: receive a bitstream comprising a combined audio signal, the combined audio signal comprising a first audio signal including speech and a second audio signal; compress the combined audio signal to provide a compressed audio signal; and control a dynamic range of the compressed audio signal to provide an output audio signal; whereby a quality of the speech included in the output audio signal is improved.

In one example, the computer device is configured to compress the combined audio signal by selectively reducing an amplitude of the second audio signal.

In one example, the computer device is configured to compress the combined audio signal by selectively increasing an amplitude of the speech included in the first audio signal.

In one example, the computer device is configured to compress the combined audio signal by matching amplitudes of the first audio signal and the second audio signal.

In one example, the computer device is configured to: selectively harmonically excite the compressed audio signal.

In one example, the computer device is configured to receive a first bitstream including the first audio signal and a second bitstream including the second audio signal; and sum the first bitstream and the second bitstream, thereby providing the combined audio signal.

In one example, the computer device is configured to normalize the first audio signal included in the first bitstream and/or the second audio signal included in the second bitstream.

In one example, the computer device is configured to adjust an amplitude of the second audio signal included in the second bitstream.

In one example, the second audio signal comprises music.

In one example, the computer device is configured to transmit the output audio signal via a transmission network having a limited bandwidth, for example a telephony service.

In one example, there is provided a method of processing audio signals on a computer device, the method being implemented by hardware of the computer device including at least a processor and a memory, the method comprising: receiving a bitstream comprising a combined audio signal, the combined audio signal comprising a first audio signal including speech and a second audio signal; compressing the combined audio signal to provide a compressed audio signal; and controlling a dynamic range of the compressed audio signal to provide an output audio signal; whereby a quality of the speech included in the output audio signal is improved.

In one example, the compressing the combined audio signal comprises selectively reducing an amplitude of the second audio signal.

In one example, the compressing the combined audio signal comprises selectively increasing an amplitude of the speech included in the first audio signal.

In one example, the compressing the combined audio signal comprises matching amplitudes of the first audio signal and the second audio signal.

In one example, the method comprises selectively harmonically exciting the compressed audio signal.

In one example, the method comprises receiving a first bitstream including the first audio signal and a second bitstream including the second audio signal; and summing the first bitstream and the second bitstream, thereby providing the combined audio signal.

In one example, the method comprises normalizing the first audio signal included in the first bitstream and/or the second audio signal included in the second bitstream.

In one example, the method comprises adjusting an amplitude of the second audio signal included in the second bitstream.

In one example, the second audio signal comprises music.

In one example, the method comprises transmitting the output audio signal via a transmission network having a limited bandwidth, for example a telephony service.

In one example, there is provided a tangible non-transient computer-readable storage medium having recorded thereon instructions which when implemented by computer device including at least a processor and a memory, cause the computer device to perform a method of processing audio signals on the computer device, the method as set forth herein.

In one example, there is provided an output audio signal provided by a computer device as set forth herein and/or a method as set forth herein.

In one example, the combined audio signal comprises an audio identifier, as described below. In one example, the first audio signal and/or the second audio signal comprises an audio identifier. Preferably, the second audio signal comprises an audio identifier.

In one example, the computer device is further configured to encode identifiers by providing audio identifiers therefrom, the computer device is configured to: provide a set of audio signals as respective bitstreams, wherein each audio signal of the set of audio signals is defined based, at least in part, on audio signal information including at least one of a type, a fundamental frequency, a time signature and a time, wherein each audio signal comprises a set of audio segments, wherein each audio segment of the set of audio segments is defined based, at least in part, on audio segment information including at least one of a frequency, an amplitude, a transform, a time duration and an envelope; receive an identifier and select a subset of audio signals from the set of audio signals according to the received identifier based, at least in part, on the audio signal information and/or the audio segment information; process the audio selected subset of audio signals by combining the selected subset of audio signals to provide an audio identifier; and output the audio identifier in an output audio signal as an output bitstream; wherein the audio identifier encodes the identifier.

In one example, the computer device is configured to combine the selected subset of audio signals by summing two of the selected subset of audio signals.

In one example, the computer device is configured to combine the selected subset of audio signals by joining two of the selected subset of audio signals.

In one example, the computer device is configured to insert an audio segment in the joined two of the selected subset of audio signals.

In one example, the computer device is configured to classify the audio signals of the set of audio signals according to a set of classifications and store the classified audio signals according to the set of classifications.

In one example, the computer device is configured to select the subset of audio signals from the set of audio signals according to the received identifier by selecting the subset of audio signals from the set of audio signals according to the received identifier based, at least in part, on the set of classifications.

In one example, the computer device is configured to transmit at least a part of the audio identifier in the output audio signal via a network.

In one example, the network comprises a telephony service.

In one example, the computer device to configured to receive at least a part of the transmitted audio identifier and to identify the identifier by decoding the received part of the transmitted audio identifier.

In one example, the audio identifier and/or the output audio signal comprises music.

In one example, the method further comprises encoding identifiers by providing audio identifiers therefrom on the computer device, the method comprising providing a set of audio signals as respective bitstreams, wherein each audio signal of the set of audio signals is defined based on audio signal information including at least one of a type, a fundamental frequency, a time signature and a time, wherein each audio signal comprises a set of audio segments, wherein each audio segment of the set of audio segments is defined based on audio segment information including at least one of a frequency, an amplitude, a transform, a duration and an envelope; receiving an identifier and selecting a subset of audio signals from the set of audio signals according to the received identifier based, at least in part, on the audio signal information and/or the audio segment information; processing the selected subset of audio signals by combining the selected subset of audio signals to provide an audio identifier; and outputting the audio identifier in an output audio signal as an output bitstream; wherein the audio identifier encodes the identifier.

In one example, combining the selected subset of audio signals comprises summing two of the selected subset of audio signals.

In one example, combining the selected subset of audio signals comprises joining two of the selected subset of audio signals.

In one example, joining the two of the selected subset of audio signals comprises inserting an audio segment therein.

In one example, the method comprises classifying the audio signals of the set of audio signals according to a set of classifications; and storing the classified audio signals according to the set of classifications.

In one example, selecting the subset of audio signals from the set of audio signals according to the received identifier comprises selecting the subset of audio signals from the set of audio signals according to the received identifier based, at least in part, on the classifications.

In one example, the method comprises transmitting at least a part of the audio identifier in the output audio signal via a network.

In one example, the network comprises a telephony service.

In one example, the method comprises receiving at least a part of the transmitted audio identifier and identifying the identifier by decoding the received part of the transmitted audio identifier.

In one example, the audio identifier and/or the output audio signal comprises music.

BRIEF DESCRIPTION OF THE DRAWINGS

For a better understanding of the invention, and to show how example embodiments may be carried into effect, reference will now be made to the accompanying drawings in which.

DETAILED DESCRIPTION

At least some of the following examples provide a computer device for and a method of improving quality of speech of combined audio signals. Many other advantages and improvements will be discussed in more detail herein.

Figure 1:
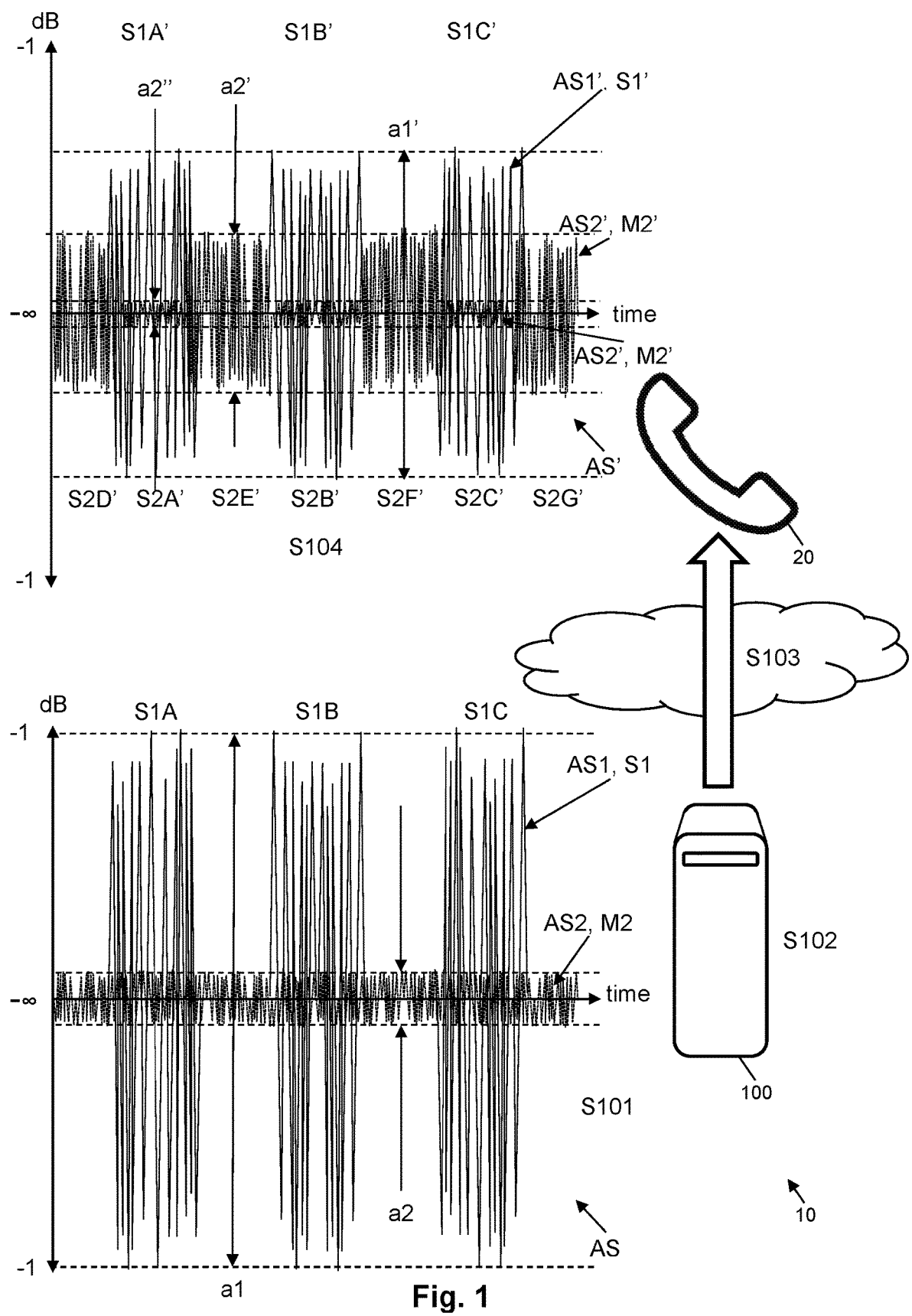
FIG. 1 is a schematic view of a system including a computer device according to an exemplary embodiment.

FIG. 1 is a schematic overview of part of a system 10 including an example computer device 100. Particularly, the computer device 100 is configured to process audio signals to improve a quality of speech included in output audio signals. In this way, intelligibility of the speech may be improved.

The computer device 100 is configured to receive a bitstream comprising a combined audio signal AS, the combined audio signal AS comprising a first audio signal AS1 including speech S1 and a second audio signal AS2. The first audio signal AS1 has an amplitude a1 (i.e. a peak volume level a1) and the second audio signal AS2 has an amplitude a2 (i.e. a peak volume level a2). In this example, the computer device 100 receives the bitstream (i.e. an input audio signal AS) as a single channel (i.e. a monophonic audio signal), as shown schematically at S101. In this example, the first audio signal AS1 consists of the speech signal S1 and the second audio signal AS2 comprises a music signal M2, including both musical instrument and speech signals. Generally, music is the ordering of tones or sounds in succession, in combination, and in temporal relationships to produce a composition having unity and continuity. Generally, music may comprise vocal, instrumental, or mechanical sounds having rhythm, melody and/or harmony. In this example, the speech signal S1 is intermittent, having three separate speech segments S1A to S1C. In this example, the music signal M2 is continuous. At S102, the computer device 100 processes combined audio signal AS. It should be understood that the computer device 100 processes the combined audio signal AS comprising both the first audio signal AS1 including the speech S1 and the second audio signal AS2 together, for example without decoding the first audio signal AS1 and the second audio signal AS2. That is, the first audio signal AS1 and the second audio signal AS2 are not separated, for example by decoding, into two separate signals for independent processing, for example. By keeping the audio signal AS1 and the second audio signal AS2 combined during the processing, processing is simplified since only the one combined audio signal AS is processed. Furthermore, by keeping the audio signal AS1 and the second audio signal AS2 combined during the processing, this processing is more widely applicable, for example to combined audio signal AS from a variety of sources, including telephony, music, radio programmes, audio advertisements and television and movie audio. Particularly, the computer device 100 compresses the combined audio signal to provide a compressed audio signal. The computer device 100 also controls a dynamic range of the compressed audio signal to provide an output audio signal AS', whereby a quality of the speech included in the output audio signal AS' is improved. In this example, the output audio signal AS' is transmitted via a network 1, as shown schematically at S103, and output via a telephone 20 to a human listener, at S104. The processed output audio signal AS' comprises the processed first audio signal AS1' including the processed speech S1', having three separate processed speech segments S1A' to S1C', and the processed second audio signal AS2' comprising the processed music signal M2'. Compared with the received combined audio signal AS, an amplitude a1' of the first audio signal AS1' is generally harmonized and reduced compared with the amplitude a1 of the received first audio signal AS1. However, while an amplitude a2' of the second audio signal AS2' (i.e. processed segments S2D' to S2G') is increased between the three separate processed speech segments S1A' to S1C', an amplitude a2" of the second audio signal AS2' (i.e. processed segments S2A' to S2C') is reduced within the three separate processed speech segments S1A' to S1C'. In other words, during segments of the processed speech S1', the amplitude a2" of the second audio signal AS2' is reduced compared with the amplitude a2 of the received second audio signal AS2. In contrast, between segments of the processed speech S1', the amplitude a2' of the second audio signal AS2' is increased compared with the amplitude a2 of the received second audio signal AS2. In this way, the quality of the speech included in the output audio signal AS' is improved, for example compared with a quality of the speech S1 included in the received first audio signal AS1.

Generally, frequencies in a frequency range from 20 Hz to 20,000 Hz (also known as an audio range) are capable of being heard by human listeners and are known as audio or sonic frequencies. Speech of a typical adult male has a fundamental frequency from 85 to 180 Hz, while speech of a typical adult female has a fundamental frequency from 165 to 255 Hz.

Generally, a voice frequency (VF) (also known as a voice band) is a frequency, within part of the audio range that is used for transmission of speech. In telephony services, the usable voice frequency band is from about 300 Hz to 3,400 Hz. That is, the fundamental frequencies of most speech are less than the lower limit of the VF band. Hence, rather than listening to a fundamental frequency, the human listener typically instead listens to only a part of a harmonic series of the fundamental frequency. However, by listening to the part of the harmonic series, an impression of hearing the fundamental frequency may be created.

A bandwidth allocated for a single voice-frequency transmission channel, for example for a telephony service, is usually 4 kHz, including guard bands, allowing a sampling rate of 8 kHz to be used as the basis of a pulse code modulation (PCM) system used for digital public switched telephone networks (PSTNs). PSTNs aggregate the world's circuit-switched telephone networks that are operated by national, regional, and/or local telephony operators, providing infrastructure and services for public telecommunications. Per the Nyquist-Shannon sampling theorem, the sampling rate of 8 kHz must be at least twice the highest component of the voice frequency via appropriate filtering prior to sampling at discrete times (equivalent to 4 kHz), for effective reconstruction of the voice signal.

Wideband audio, also known as HD voice, extends the frequency range of audio signals transmitted over telephone lines to from 50 Hz to 7 kHz, resulting in higher quality speech. However, wideband audio is generally not available.

By improving the quality of the speech included in the output audio signal AS', intelligibility of the speech may be improved. For example, a clearer, overall sound quality of the output audio signal AS' may be provided. In this way, the human listener may more easily recognize voices, distinguish confusing sounds and/or understand accented speakers, for example. In this way, the human listener may more easily decipher or comprehend words that have close sounds, such as 's' and 'f', which may be difficult to distinguish on telephony services, for example. In this way, the human listener may better hear quieter talkers and/or to understand double-talk, when more than one person is speaking at the same time, for example. In this way, the human listener may have a reduced listening effort and/or a decreased cognitive load, resulting in increased productivity and/or lessened fatigue, for example. In this way, the human listener may better understand the speech included in the output audio signal AS' when talkers are using a speakerphone, in the presence of background noise and/or when using a hearing aid, for example.

In this simplified example, the computer device 100 is coupled by the system 10 to the telephone 20 via the network 1. For example, the network 1 can be a private network, a virtual private network, an intranet, a cloud, the Internet, a telephony service or a broadcasting network.

Figure 2:
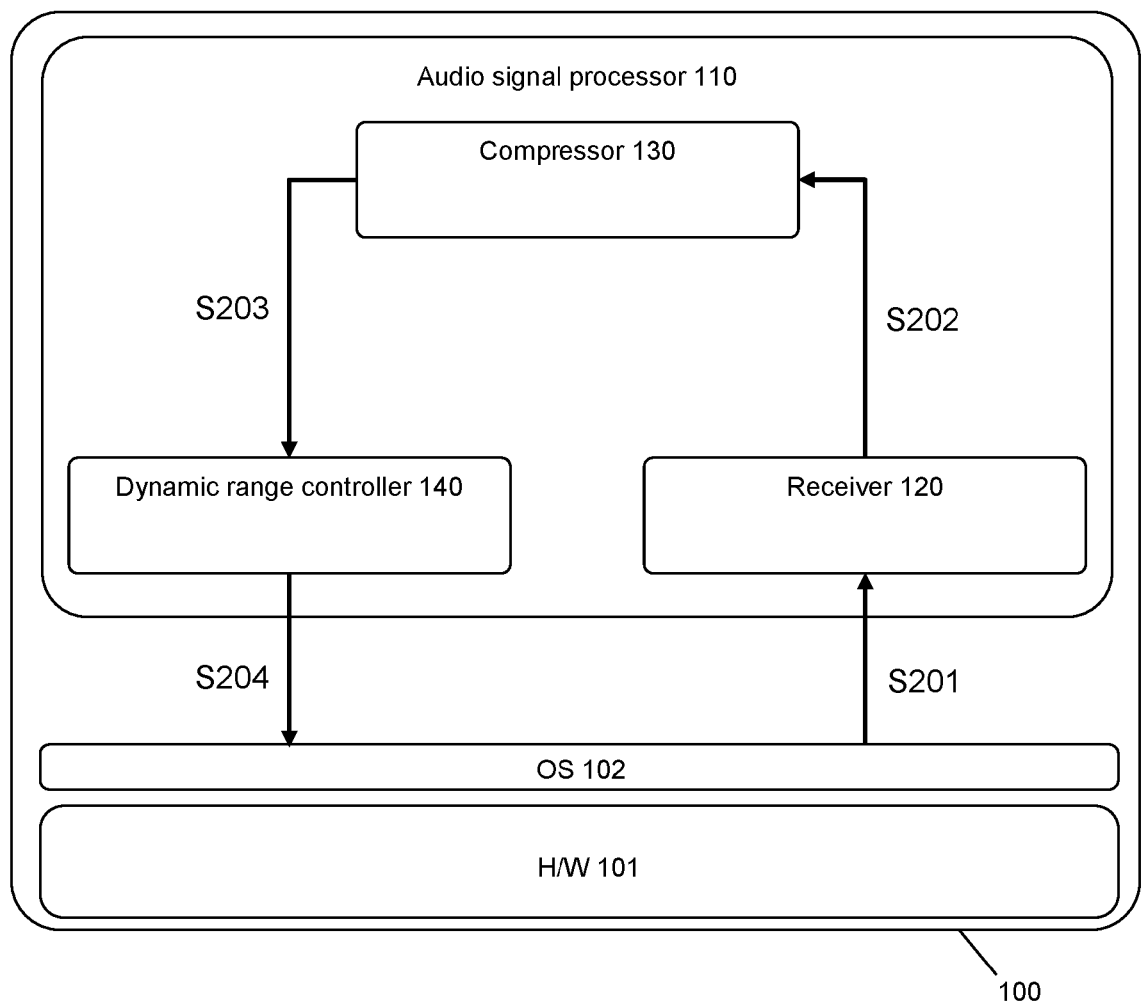
FIG. 2 is a schematic view of the computer device of FIG. 1, in more detail.

FIG. 2 is a schematic view of the computer device 100, in more detail.

In this example, the computer device 100 comprises an audio signal processor 110, wherein the audio signal processor 110 is configured to receive the bitstream comprising the combined audio signal, the combined audio signal comprising the first audio signal including the speech and the second audio signal; compress the combined audio signal to provide the compressed audio signal; and control the dynamic range of the compressed audio signal to provide the output audio signal; whereby a quality of the speech included in the output audio signal is improved, for example compared with a quality of the speech included in the received first audio signal.

The computer device 100 may take any suitable form factor, which might be a server, a desktop computer, a portable computing device, laptop, tablet, smartphone, an audio processor, etc. The illustrated computer device 100 comprises a layer of physical hardware H/W 101, which suitably includes memory, processors (CPUs), I/O input/output interfaces (e.g. NIC network interface cards, USB universal serial bus interfaces, etc.), storage (e.g. solid state non-volatile storage or hard disk drive) and so on. The hardware layer 101 supports an operating system 102 to provide a runtime environment for execution of user processes or productivity applications. This runtime environment typically provides resources such as installed software, system agent services, drivers, and files.

In more detail, the audio signal processor 110 comprises a receiver 120, a compressor 130 and a dynamic range controller 140. While in this example, the audio signal processor 110 comprises the receiver 120, the compressor 130 and the dynamic range controller 140, it should be understood that this arrangement is not limiting. For example, the audio signal processor 110 may be configured to provide the processing by the receiver 120, the compressor 130 and/or the dynamic range controller 140. For example, the processing by the receiver 120, the compressor 130 and/or the dynamic range controller 140 may in turn be provided by one or more units, modules, dynamic link libraries (DLLs), plug-ins, services or servers respectively.

The receiver 120 is configured to receive the bitstream comprising the combined audio signal, the combined audio signal comprising the first audio signal including the speech and the second audio signal. The bitstream comprising the combined audio signal may originate from audio stored in an uncompressed audio format, for example WAV, AIFF, AU or raw header-less PCM, a lossless compression audio format, for example FLAC, TTA, ATRAC Advanced Lossless, ALAC MPEG-4 SLS, MPEG-4 ALS, MPEG-4 DST, Windows Media Audio Lossless (WMA Lossless), and Shorten (SHN) and/or a lossy compression audio format, for example Opus, MP3, Vorbis, Musepack, AAC, ATRAC and Windows Media Audio Lossy (WMA lossy). Alternatively and/or additionally, the combined audio signal may originate from audio stored in a multimedia or video format. Alternatively and/or additionally, the combined audio signal may originate from a microphone, at least in part. For example, the speech included in the first audio signal may originate from a microphone.

The compressor 130 is configured to compress the combined audio signal to provide the compressed audio signal. It should be understood that dynamic range compression (DRC) (also known as compression) is an audio signal processing technique that reduces a volume of loud sounds and/or amplifies quiet sounds, thereby reducing or compressing a dynamic range of audio signals. That is, the compression of the combined audio signal described herein is contrasted from data compression, for example lossy or lossless data compression. In other words, compression is an audio signal processing operation that reduces the volume of loud sounds or amplifies quiet sounds thus reducing or compressing an audio signal's dynamic range. It can also be used in side-chaining to reduce the volume of one audio source when another audio source reaches a certain level, as described below in more detail.

Limiting is a type of compression but differs in degree and perceived effect. A limiter is a compressor with a high ratio and, generally, a fast attack time. In contrast, expanders increase the dynamic ranges of audio signal. Expanders are generally used to further quieten quiet sounds by reducing a level of an audio signal that falls below a threshold level. A noise gate is a type of expander. In more detail, downward compression reduces loud sounds over a certain threshold level while quieter sounds are unmodified. A limiter is an extreme type of downward compression. Upward compression increases the loudness of sounds below a certain threshold while louder sounds are unmodified. Note that both downward and upward compression reduce the dynamic ranges of audio signals.

To compress the combined audio signal, the compressor 130 may be configured to perform feed-forward type compression. The compressor 130 may be configured to split or duplicate the combined audio signal, thereby providing two copies. The compressor 130 may be configured to send one copy to a variable-gain amplifier and the other copy to a side-chain. The compressor 130 may be configured to measure a signal level in the side-chain and apply a desired gain to the variable-gain amplifier based, at least in part, on the measured signal level.

The compressor 130 may be configured to reduce the level of the combined audio signal by gain reduction if an amplitude of the combined audio signal exceeds a certain threshold. The threshold may be set in decibels (dB). A lower threshold, for example −60 dB, means that a larger portion of the combined audio signal is compressed, compared with a higher threshold, for example −5 dB. The compressor 130 may be configured to reduce the level of the combined audio signal by an amount of gain reduction determined by a ratio. For example, a ratio of 4:1 means that if an input level is 4 dB over the threshold, the output signal level is set at 1 dB over the threshold, such that the gain (level) has been reduced by 3 dB. The highest ratio of −3:1 may be known as limiting and may be typically achieved in practice using a ratio of 60:1. The compressor 130 may be configured to reduce the level of the combined audio signal by reducing the level thereof after the input signal has fallen below the threshold, during a first amount of time determined by a release, typically set in ms. Hence, a release phase may be the first amount of time when the compressor 130 is increasing a gain to the level determined by the ratio, or, to zero dB, once the level has fallen below the threshold. The compressor 130 may be configured to reduce the level of the combined audio signal by decreasing a gain to reach the level that is determined by the ratio during a second amount of time determined by an attack, typically set in ms. Hence, an attack phase may be the second amount of time when the compressor 130 is decreasing gain to reach the level that is determined by the ratio.

The dynamic range controller 140 is configured to control, for example limit, the dynamic range of the compressed audio signal to provide the output audio signal. In this way, an overall dynamic range of the output audio signal may be limited, for example, for output via a telephone i.e. for transmission via a telephony service. For example, the dynamic range controller 140 may be configured to control the dynamic range by hard limiting. Generally, hard limiting is a type of dynamic range compression that allows signals below a specified input amplitude, power or level to pass unaffected while attenuating peaks of stronger signals that exceed this threshold. An amplitude may be in a range from 0 dB to −20 dB, preferably in a range from −2.5 dB to −15 dB, more preferably in a range from −5 dB to −10 dB. A boost may be in a range from 0 dB to 0 dB to −20 dB, preferably in a range from −0.5 dB to −10 dB, more preferably in a range from −1 dB to −5 dB. A look ahead may be in a range from 0 ms to 100 ms, preferably from 0 ms to 50 ms, more preferably from 0 ms to 20 ms. A release may be in a range from 10 to 1000 ms, preferably from 50 ms to 500 ms, more preferably from 75 ms to 150 ms.

In this way, the quality of the speech included in the output audio signal is improved.

In one example, the computer device 100 is configured to compress the combined audio signal by selectively reducing an amplitude of the second audio signal, for example within and/or only within speech segments of the speech included in the first audio signal. By selectively reducing an amplitude of the second audio signal, a side-chain trigger point may be set. Selectively reducing the amplitude of the second audio signal may be performed by tube compression, for example. In one example the compressor 130 is configured to perform tube compression according to a threshold in a range from −10 dB to −40 dB, preferably from −15 dB to −35 dB, more preferably from −20 dB to −30 dB. A gain may be in a range from 0 dB to 10 dB, preferably from 0 dB to 5 dB, more preferably from 0 dB to 2 dB. An attack may be in a range from 0 ms to 100 ms, preferably from 0 ms to 50 ms, more preferably from 0 ms to 20 ms. A release may be in a range from 250 to 2500 ms, preferably from 500 ms to 1750 ms, more preferably from 750 ms to 1250 ms. For telephony systems, for example, a minimum amplitude of the second audio signal may be predetermined, below which the telephony systems cut the second audio signal.

In one example, the computer device is configured to compress the combined audio signal by selectively increasing an amplitude of the speech included in the first audio signal. Selectively increasing the amplitude of the speech included in the first audio signal may be performed by side-chain compression (also known as ducking), for example. In this way, intelligibility of the speech included in the first audio signal may be improved. In one example the compressor 130 is configured to perform side-chain compression. In more detail, the compressor 130 may be configured to operate as described above by splitting or duplicating the combined audio signal such that both inputs are supplied with the same signal. To perform side-chain compression, the compressor 130 may be configured to use different inputs such that an amplitude of the second audio signal may be selectively reduced according to an amplitude of the first audio signal, for example based on a side-chain trigger point. Additionally and/or alternatively, the compressor 130 may be configured to control equalization to thereby selectively reduce amplitudes of signals having strong spectral content within certain frequency ranges. For example, the compressor 130 may be configured to operate as a de-esser, thereby reducing a level of vocal sibilance in a predetermined frequency range, such as from 2 to 10 kHz, preferably 6 to 9 kHz. De-essing (also known as desibilizing) is an audio processing method of reducing excessive prominence of sibilant consonants, such as 's', 'z', 'c' and 'sh', in recordings of the human voice. The compressor 130 may be configured to selectively increase the amplitude of the speech included in the first audio signal by compressing frequencies in a frequency band from 20 Hz to 20,000 Hz, preferably from 100 Hz to 10,000 Hz, more preferably from 300 Hz to 3,400 Hz. A compression level may be in a range from −5 dB to −50 dB, preferably from −10 dB to −40 dB, more preferably from −15 dB to −30 dB. A compression amount may be in a range from 10% to 80%, preferably from 20% to 60%, more preferably from 30% to 40%. A dynamic range may be in a range from 10 dB to 80 dB, preferably from 20 dB to 70 dB, more preferably from 30 dB to 50 dB.

In one example, the computer device 100 is configured to compress the combined audio signal by matching amplitudes of the first audio signal and the second audio signal. For example, the computer device 100 may be configured to dynamically compress the combined audio signal, thereby balancing amplitudes of the first audio signal and the second audio signal. In this way, an adaptive balance between the speech included in the first audio signal and for example, music included in the second audio signal, may be achieved. The compressor 130 may be configured to selectively compress the combined audio signal according to a first set of ratios for respective thresholds. The compressor 130 may be configured to selectively expand the combined audio signal according to a second set of ratios for respective thresholds. For example, compressor 130 may be configured to compress the combined audio signal according to a first ratio of the first set above a respective threshold and/or to expand the combined audio signal according to a first ratio of the second set below a respective threshold. The first ratio of the first set may be in a range from 2:1 to 10:1, preferably in a range from 3:1 to 6:1, more preferably in a range from 4:1 to 5:1. The respective threshold of the first ratio of the first set may be in a range from −5 dB to −40 dB, preferably from −10 dB to −30 dB, more preferably from −15 dB to −25 dB. The first ratio of the second set may be in a range from 1:1 to 10:1, preferably in a range from 1:1 to 5:1, more preferably in a range from 1:1 to 2:1. The respective threshold of the first ratio of the second set may be in a range from −5 dB to −50 dB, preferably from −10 dB to −40 dB, more preferably from −20 dB to −30 dB. Additionally and/or alternatively, the compressor 130 may be configured to compress the combined audio signal according to a second ratio of the first set below a respective threshold and/or to expand the combined audio signal according to a second ratio of the second set below a respective threshold. The second ratio of the first set may be in a range from 1:1 to 10:1, preferably in a range from 1:1 to 5:1, more preferably in a range from 1:1 to 2:1. The respective threshold of the second ratio of the first set may be in a range from −10 dB to −100 dB, preferably in a range from −25 dB to −75 dB, more preferably in a range from −50 dB to −70 dB. The second ratio of the second set may be in a range from 1:1 to 10:1, preferably in a range from 1:1 to 5:1, more preferably in a range from 1:1 to 2:1. The respective threshold of the second ratio of the second set may be in a range from −10 dB to −150 dB, preferably in a range from −50 dB to −125 dB, more preferably in a range from −75 dB to −100 dB. Additionally and/or alternatively, compressor 130 may be configured to expand the combined audio signal according to a third ratio of the second set below a respective threshold. The third ratio of the second set may be in a range from 10:1 to −3:1, preferably in a range from 50:1 to −3:1, more preferably in a range from 100:1 to −3:1. The respective threshold of the second ratio of the second set may be in a range from −10 dB to −200 dB, preferably in a range from −50 dB to −150 dB, more preferably in a range from −75 dB to −125 dB.

In one example, the computer device 100 is configured to selectively harmonically excite the compressed audio signal, for example in a range from 1% to 100%, preferably in a range from 2% to 50%, more preferably in a range from 5% to 15%. In this way, high frequency harmonics of the speech included in the first audio signal may be excited, for example, thereby further improving the quality of the output audio signal. Generally, harmonic exciting is an audio signal processing technique used to enhance audio signals by dynamic equalization, phase manipulation, harmonic synthesis of (usually) high frequency signals, and through the addition of subtle harmonic distortion. Harmonic exciting typically involves creation of higher order harmonics from fundamental frequencies in audio signals, resulting in clearer high frequencies.

In one example, the computer device 100 is configured to receive a first bitstream including the first audio signal and a second bitstream including the second audio signal. The first bitstream and/or the second bitstream may be as described above with respect to the bitstream. That is, the first bitstream and/or the second bitstream may respectively originate from audio stored in an uncompressed audio format, a lossless compression audio format, and/or a lossy compression audio format. Alternatively and/or additionally, the first bitstream and/or the second bitstream may respectively originate from audio stored in a multimedia or video format. Alternatively and/or additionally, the first bitstream and/or the second bitstream may respectively originate from a microphone, at least in part.

In one example, the computer device 100 is configured to sum the first bitstream and the second bitstream, thereby providing the combined audio signal. Generally, summing is an audio mixing process whereby energy levels of individual audio signals, such as the first audio signal and the second audio signal, when combined are at a desired total energy output level (i.e. a summed level). Note that summing (also known as combining or collapsing) of the first audio signal included in the first bitstream and the second audio signal included in the second bitstream is not a linear addition of the amplitudes thereof. The first audio signal included in the first bitstream and the second audio signal included in the second bitstream may be coherent or incoherent audio signals. For example, if the first audio signal and the second audio signal are coherent audio signals, if the first audio signal has a first level $L_1$ dB and the second audio signal has a second level of $L_2$ dB, then the combined audio signal provided by summing the first bitstream and the second bitstream has a level $L_3$ dB where $L_3 = 20 \log_{10} (10^{L_1/10} + 10^{L_2/10})$. For example, if the first audio signal and the second audio signal are incoherent audio signals, if the first audio signal has a first level $L_1$ dB and the second audio signal has a second level of $L_2$ dB, then the combined audio signal provided by summing the first bitstream and the second bitstream has a level $L_3$ dB where $L_3 = 10 \log_{10} (10^{L_1/10} + 10^{L_2/10})$. In one example, the first audio signal and the second audio signal are incoherent audio signals.

In one example, the computer device 100 is configured to debreathe the speech signal included in the first audio signal included in the first bitstream. In this way, non-speech elements and/or undesired portions of the speech signal may be reduced or removed, for example, thereby improving the quality of the speech included in the output audio signal.

In one example, the computer device 100 is configured to normalize the first audio signal included in the first bitstream. In this way, a level of the first audio signal may be standardized, for example. Generally, normalization comprises applying a constant amount of gain to an audio signal to bring an average and/or a peak amplitude to a target level. Since the same amount of gain is applied across the entire audio signal, a signal-to-noise ratio and/or relative dynamics are unchanged. The computer device 100 may be configured to normalize the first audio signal included in the first bitstream to a level in a range from −10 dB to 10 dB, preferably in a range from −5 dB to 5 dB, more preferably in a range from 0 dB to 1 dB.

In one example, the computer device 100 is configured to normalize the second audio signal included in the second bitstream. In this way, a level of the second audio signal may be standardized, for example. The computer device 100 may be configured to normalize the second audio signal included in the second bitstream to a level in a range from 0 dB to −50 dB, preferably in a range from −5 dB to −25 dB, more preferably in a range from −10 dB to −20 dB. The range may be full scale i.e. dBFS. In one example, the computer device 100 is configured to normalize the second audio signal included in the second bitstream according to a broadcast standard, for example ITU-R BS.1770-3. ITU-R BS.1770-3 is a loudness standard designed to enable normalization of audio levels for broadcast.

In one example, the computer device 100 is configured to adjust an amplitude of the second audio signal included in the second bitstream. In this way, a volume of the second audio signal may be set before summing the first bitstream and the second bitstream. The amplitude of the second audio signal may be adjusted corresponding to a tube compression threshold for compression of the combined audio signal, as described above. Hence, the amplitude of the second audio signal may be adjusted in a range from −10 dB to −40 dB, preferably in a range from −15 dB to −35 dB, more preferably in a range from −20 dB to −30 dB.

As shown in FIG. 2, at S201, the computer device 100 receives the bitstream, the bitstream comprising the combined audio signal, the combined audio signal comprising the first audio signal including speech and the second audio signal. In this example, the bitstream is received by the audio signal processor 110, specifically by the receiver 120 comprised therein, via the operating system 102 and/or the hardware 101 of the computer device 100. For example, the bitstream may be a single audio channel originating from an mp3 file stored on the computer device 100.

At S202, the computer device 100 compresses the combined audio signal to provide a compressed audio signal. In this example, the combined audio signal is compressed by the audio signal processor 110, specifically by the compressor 130 comprised therein.

At S203, a dynamic range of the compressed audio signal is controlled to provide the output audio signal. In this example, the dynamic range is controlled by the audio signal processor 110, specifically by the dynamic range controller 140 comprised therein.

At S204, the provided output audio signal, having the improved quality of the speech included in the output audio signal, is optionally stored on the computer device 100, for example as another mp3 file. The output audio signal may be transmitted, for example via a telephony service.

Figure 3:
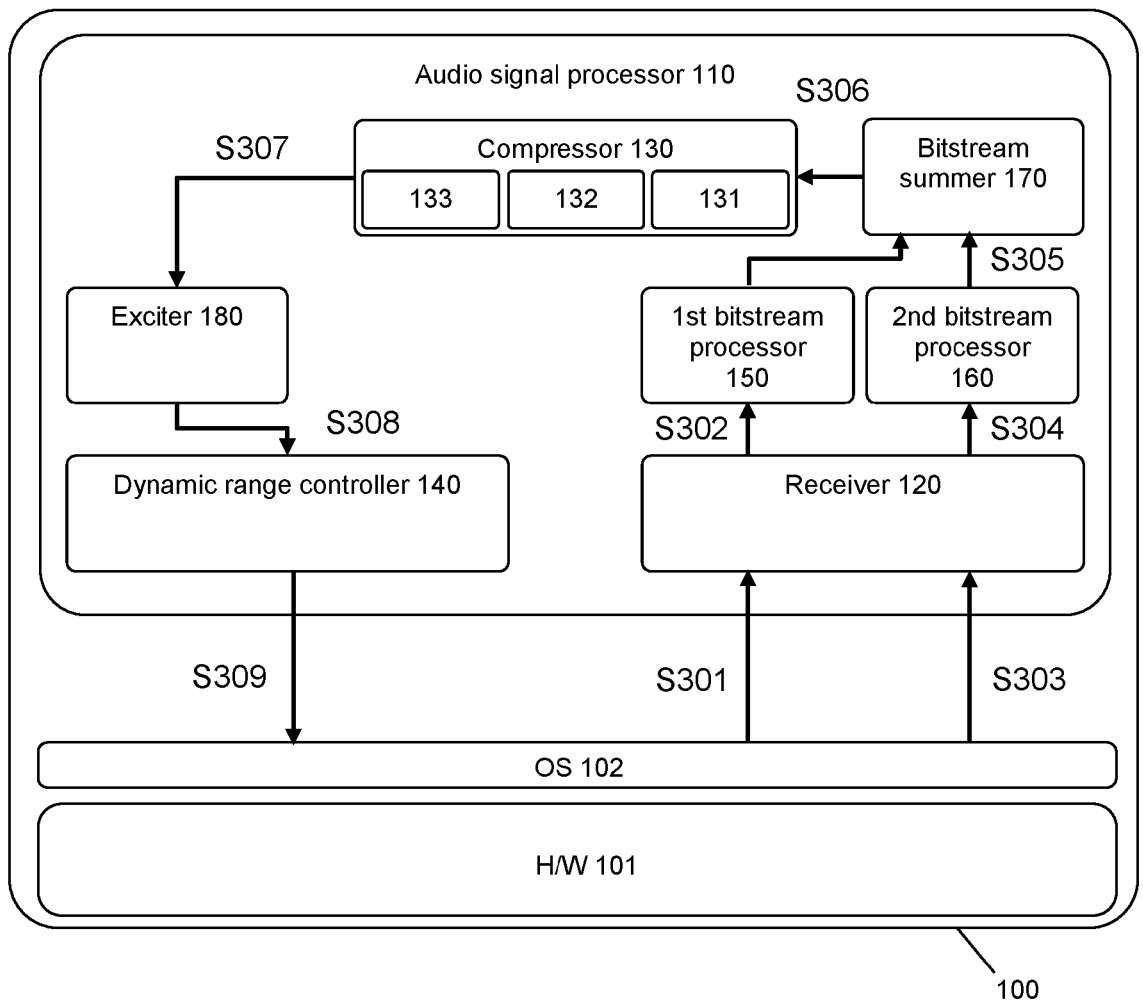
FIG. 3 is a schematic view of the computer device of FIG. 2, in more detail.

FIG. 3 is a schematic view of the computer device of FIG. 2, in more detail.

In addition to the receiver 120, the compressor 130 and the dynamic range controller 140 as described above, the audio signal processor 110 optionally comprises a first bitstream processor 150, a second bitstream processor 160, a bitstream summer 170 and an exciter 180. The compressor 130 optionally comprises a tube compressor 131, a speech compressor 132 and a dynamic compressor 133.

In more detail, the first bitstream processor 150 is configured to debreathe the speech signal included in the first audio signal included in the first bitstream and/or to normalize the first audio signal included in the first bitstream, as described above with reference to FIG. 2. The second bitstream processor 160 is configured to normalize the second audio signal included in the second bitstream and/or adjust an amplitude of the second audio signal included in the second bitstream, as described above with reference to FIG. 2. The bitstream summer 170 is configured to sum the first bitstream and the second bitstream, thereby providing the combined audio signal, as described above with reference to FIG. 2. The exciter 180 is configured to selectively harmonically excite the compressed audio signal, as described above with reference to FIG. 2. The tube compressor 131 is configured to compress the combined audio signal by selectively reducing an amplitude of the second audio signal, as described above with reference to FIG. 2. The speech compressor 132 is configured to compress the combined audio signal by selectively increasing an amplitude of the speech included in the first audio signal, as described above with reference to FIG. 2. The dynamic compressor 133 is configured to compress the combined audio signal by matching amplitudes of the first audio signal and the second audio signal, as described above with reference to FIG. 2.

At S301, the receiver 120 receives the first bitstream including the first audio signal including speech.

At S302, the first bitstream processor 150 optionally debreathes the speech signal included in the first audio signal included in the first bitstream and/or optionally normalizes the first audio signal included in the first bitstream.

At S303, the receiver 120 receives the second bitstream including the second audio signal.

At S304, the second bitstream processor 160 optionally normalizes the second audio signal included in the second bitstream and/or optionally adjusts an amplitude of the second audio signal included in the second bitstream.

At S305, the bitstream summer 170 sums the first bitstream and the second bitstream, thereby providing the combined audio signal.

At S306, the compressor 130 compresses the combined audio signal. In more detail, the tube compressor 131 compresses the combined audio signal by selectively reducing an amplitude of the second audio signal. The speech compressor 132 compresses the combined audio signal by selectively increasing an amplitude of the speech included in the first audio signal. The dynamic compressor 133 compresses the combined audio signal by matching amplitudes of the first audio signal and the second audio signal.

At S307, the exciter 180 optionally selectively harmonically excites the compressed audio signal.

At S308, the dynamic range controller 140 controls a dynamic range of the compressed audio signal, as described above at S203.

At S309 the provided output audio signal, having the improved quality of the speech included in the output audio signal, is optionally stored on the computer device 100, as described above at S204.

Figure 4:
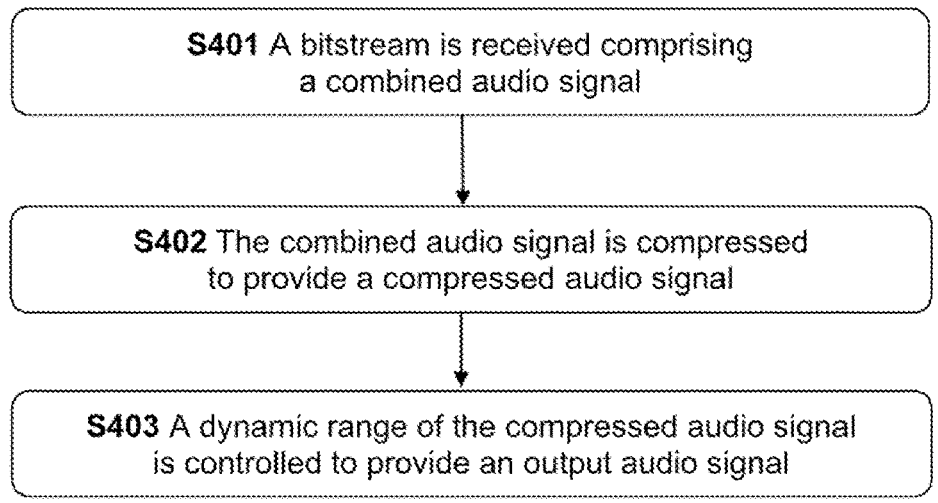
FIG. 4 is a schematic flow diagram of a method of processing audio signals according to an exemplary embodiment.

FIG. 4 is a schematic flow diagram of a method of processing audio signals according to an exemplary embodiment. Particularly, the method of processing audio signals is implemented on a computer device, for example the computer device 100 as described above, the method being implemented by hardware of the computer device including at least a processor and a memory.

At S401, a bitstream is received, the bitstream comprising a combined audio signal, the combined audio signal comprising a first audio signal including speech and a second audio signal.

At S402, the combined audio signal is compressed to provide a compressed audio signal.

At S403, a dynamic range of the compressed audio signal is controlled to provide an output audio signal.

In this way, a quality of the speech included in the output audio signal is improved.

The method may include any of the steps described herein.

Figure 5:
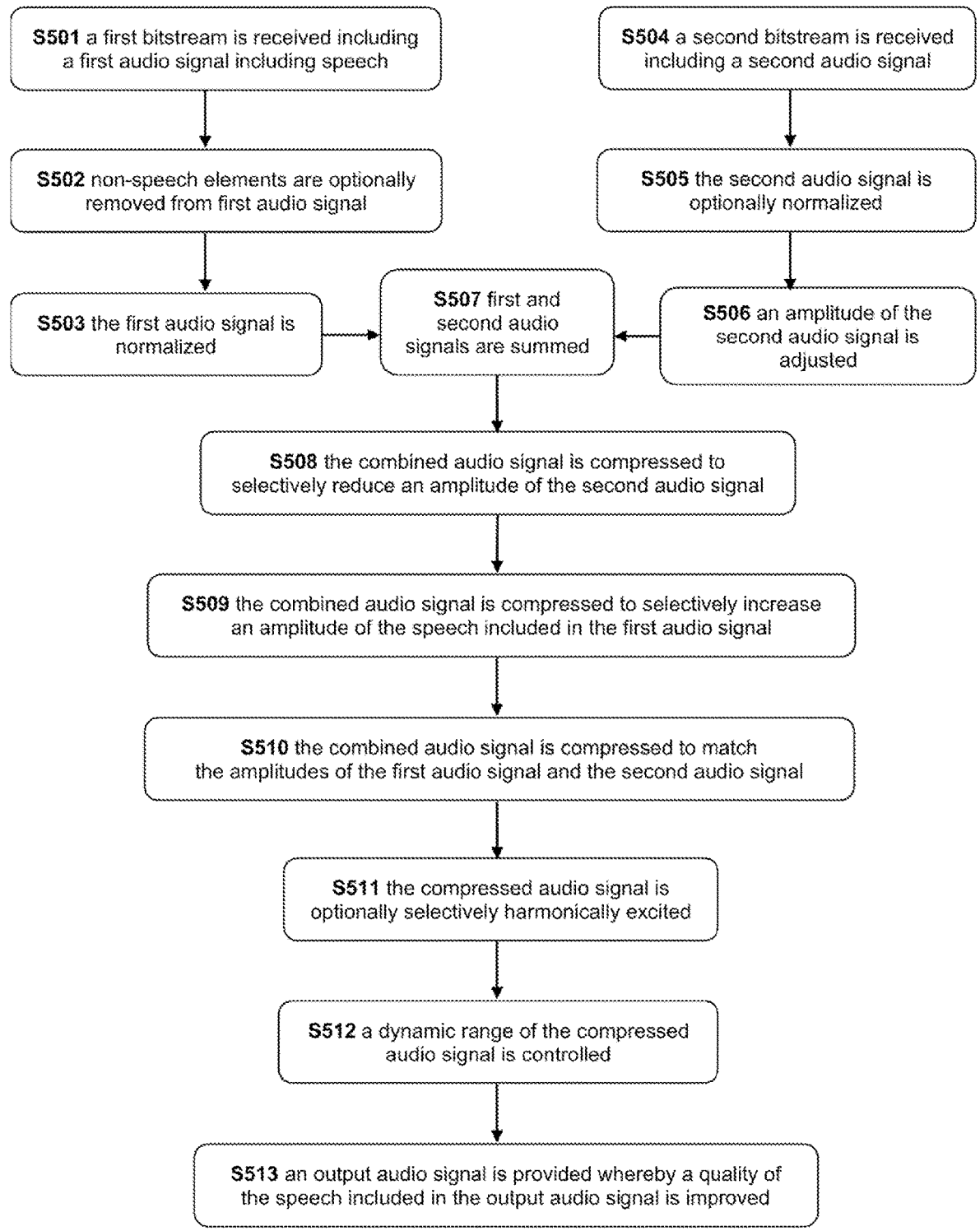
FIG. 5 is a schematic flow diagram of the method of processing audio signals of FIG. 4, in more detail.

FIG. 5 is a schematic flow diagram of the method of processing audio signals of FIG. 4, in more detail.

At S501, a first bitstream including a first audio signal including speech is received.

At S502, non-speech elements are optionally removed from the first audio signal. For example, breaths and/or other noises may be removed the first audio signal.

At S503, the first audio signal included in the first bitstream is normalized, for example in a range from 0 dB to 1 dB.

At S504, a second bitstream including a second audio signal is received. In this example, the second audio signal comprises music.

At S505, the second audio signal included in the second bitstream is optionally normalized according to ITU-R BS.1770-3, for example in a range from −10 dB to −20 dB full scale (FS).

At S506, an amplitude of the second audio signal included in the second bitstream is adjusted, for example by setting a volume level of the second audio signal in a range from −20 dB to −30 dB.

At S507, the first audio signal and the second audio signal are summed, thereby providing a combined audio signal comprising the first audio signal including speech and the second audio signal.

At S508, the combined audio signal is compressed to selectively reduce an amplitude of the second audio signal, for example by compressing the combined audio signal, according to example parameters of a threshold in a range from −20 dB to −30 dB, a gain in a range from 0 dB to 2 dB, an attack in a range from 0 ms to 20 ms and a release in a range from 750 ms to 1250 ms.

At S509, the combined audio signal is compressed to selectively increase an amplitude of the speech included in the first audio signal, for example by compressing frequencies in a frequency band of 300 Hz to 3,400 Hz, with a level set in a range from 015 dB to −30 dB, an amount set in a range from 30% to 40% and a dynamic range in a range from 30 dB to 50 dB.

At S510, the combined audio signal is compressed to match amplitudes of the first audio signal and the second audio signal, for example by compressing by a first ratio in a range from 1:1 to 5:1 above a threshold in a range from −15 dB to −25 dB, by expanding by a second ratio in a range from 1:1 to 2:1 below a threshold in a range from −20 dB to −30 dB, by compressing by a third ratio in a range from 1:1 to 5:1 below a threshold in a range from −50 dB to −70 dB, by expanding by a fourth ratio in a range from 1:1 to 5:1 below a threshold in a range from −75 dB to −100 dB and by expanding by −3:1 below a threshold in a range from −75 dB to −125 dB.

At S511, the compressed audio signal is optionally selectively harmonically excited, for example by an amount in a range from 5% to 15%.

At S512, a dynamic range of the compressed audio signal is controlled, for example by setting an amplitude in a range from −5 dB to −10 dB, a boost in a range from −0.5 dB to −10 dB, a look ahead in a range from 0 ms to 20 ms and a release in a range from 75 ms to 150 ms.

At S513, an output audio signal is provided, whereby a quality of the speech included in the output audio signal is improved, for example compared with a quality of the speech included in the received first audio signal. The output audio signal may be stored, for example as a bitstream in a mp3 file. The output audio signal may be transmitted, for example via a telephony service.

FIGS. 6A to 6F are schematic views of a combined audio signal processed according to the method of FIG. 5.

Figure 6A:
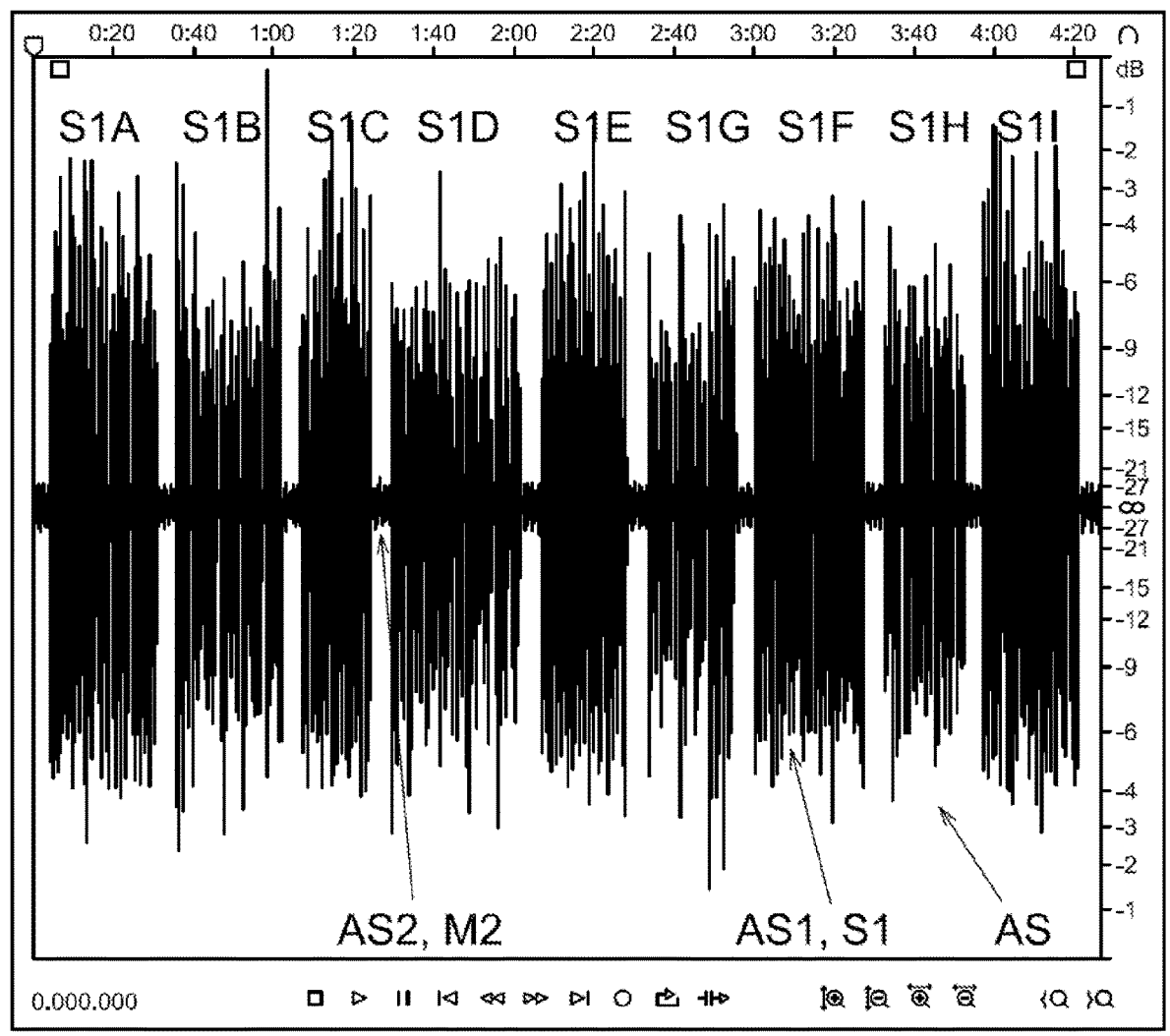
FIGS. 6A to 6F are schematic views of a combined audio signal processed according to the method of FIG. 5.

FIG. 6A shows the combined audio signal AS comprising the first audio signal AS1 including speech S1 and the second audio signal AS2, provided by summing the first audio signal AS1 and the second audio signal AS2, as described with reference to S507. In this example, the first audio signal AS1 consists of the speech signal S1 and the second audio signal AS2 comprises a music signal M2, including both musical instrument and speech signals. A duration of the combined audio signal is about 270 s. In this example, the speech signal S1 is intermittent, having nine separate speech segments S1A to S1I, having durations of about from 15 s to 25 s, having mutual separations of about 3 s and having peak volume levels of about −1 dB. In this example, the second audio signal AS2 is continuous, having a peak volume level of approximately −27 dB.

Figure 6B:
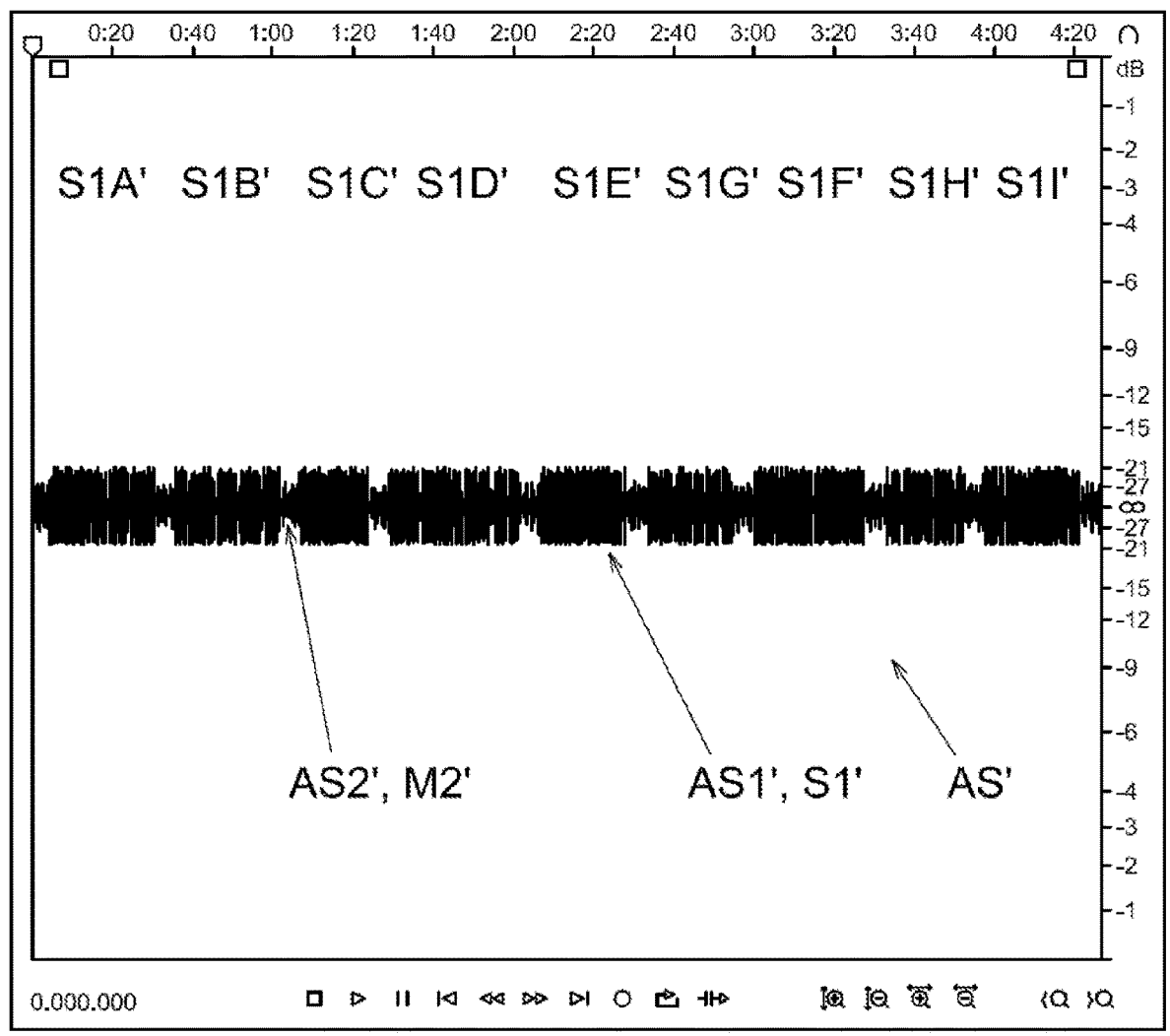

FIG. 6B shows the combined audio signal AS comprising the first audio signal AS1 including speech S1 and the second audio signal AS2, provided by compressing the combined audio signal AS to selectively reduce an amplitude of the second audio signal AS2, as described with reference to S508. While the first audio signal AS1 now has a peak volume level of approximately −21 dB, the second audio signal AS2 has a peak volume level of approximately −27 dB, as described previously.

Figure 6C:
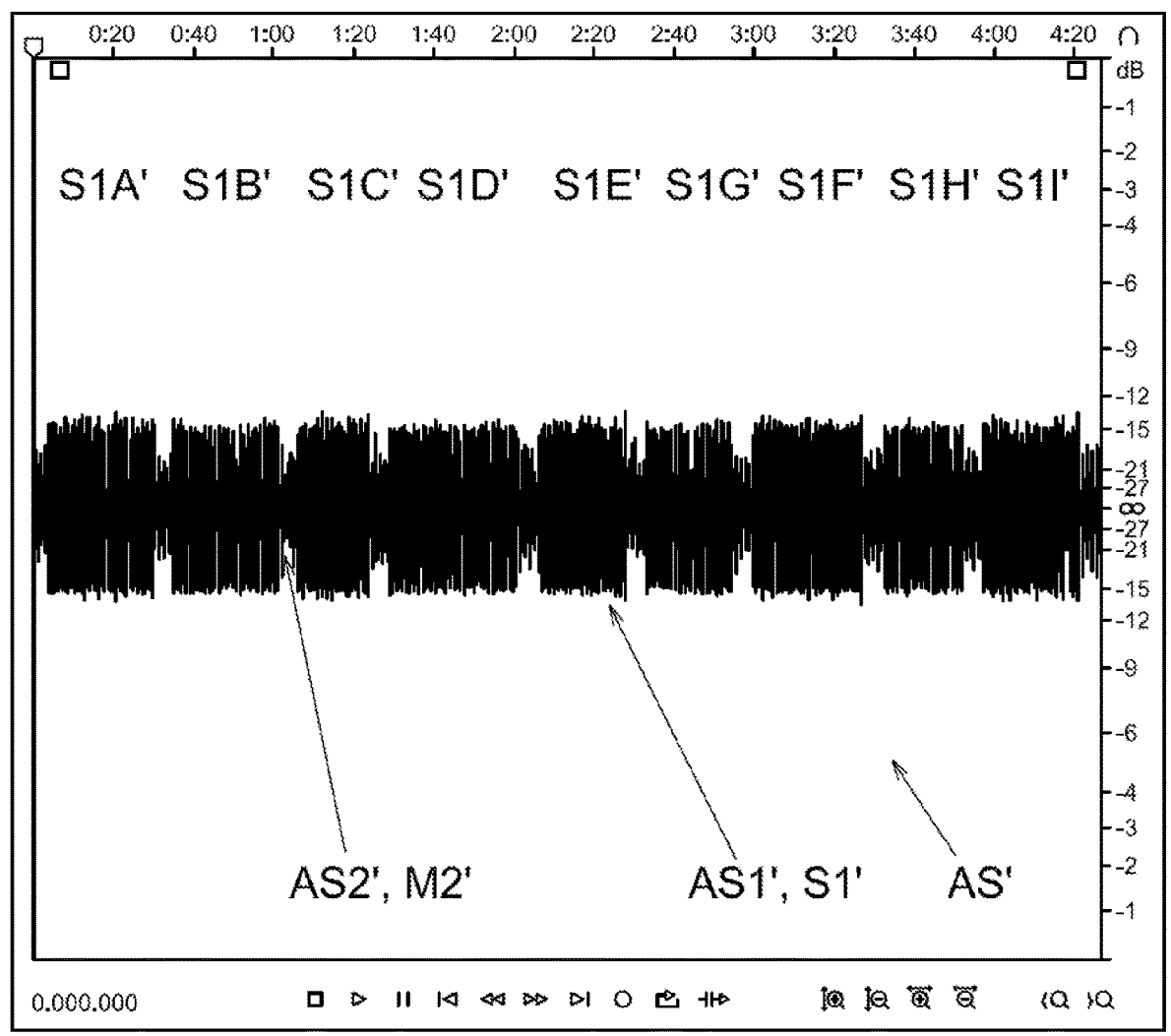

FIG. 6C shows the combined audio signal AS comprising the first audio signal AS1 including speech S1 and the second audio signal AS2, provided by compressing the combined audio signal AS to selectively increase an amplitude of the speech S1 included in the first audio signal AS1, as described with reference to S509. While the first audio signal AS1 now has a peak volume level of approximately −15 dB, the second audio signal AS2 now has a peak volume level of approximately −18 dB.

Figure 6D:
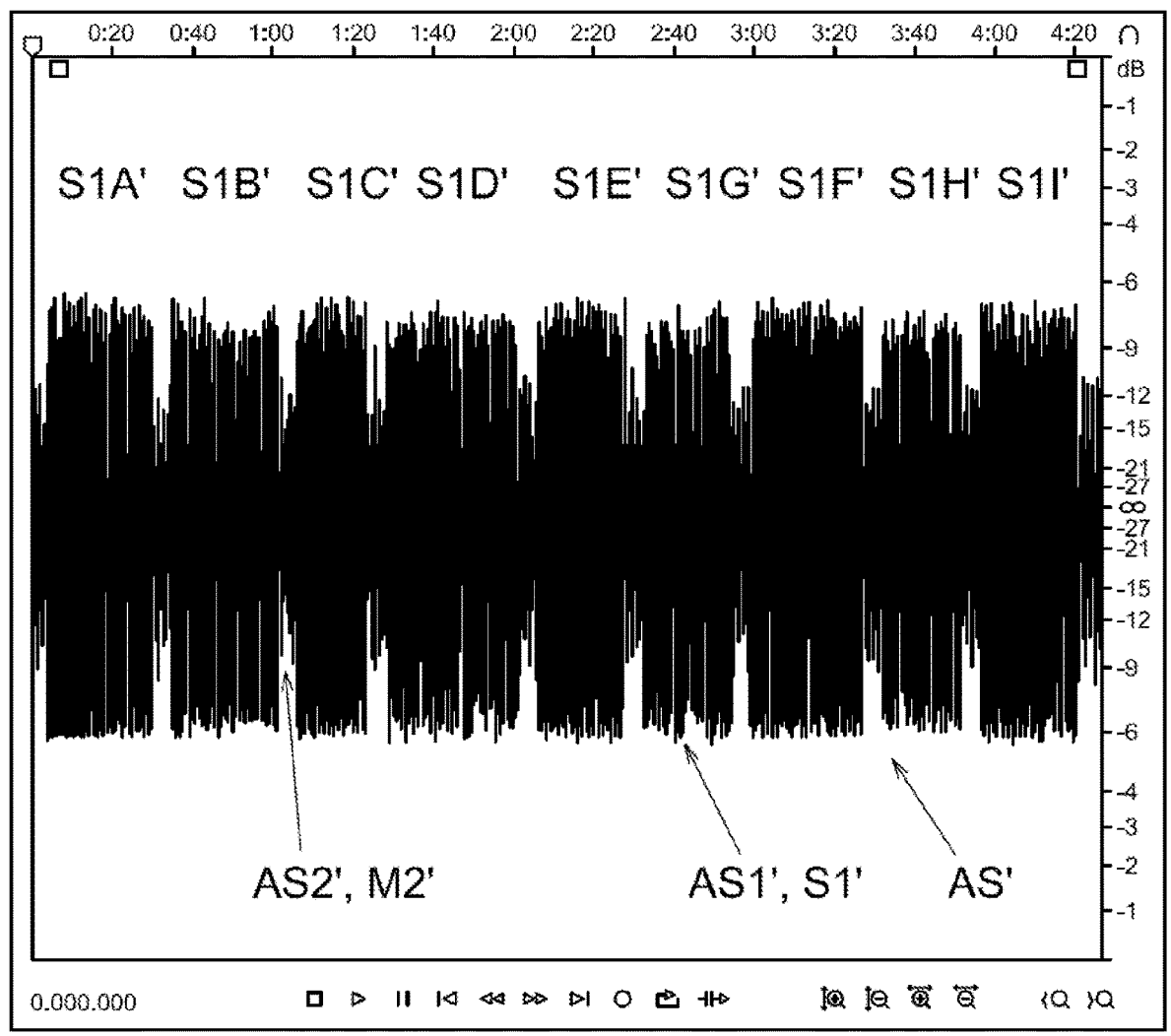

FIG. 6D shows the combined audio signal AS comprising the first audio signal AS1 including speech S1 and the second audio signal AS2, provided by compressing the combined audio signal AS to match amplitudes of the first audio signal AS1 and the second audio signal AS2, as described with reference to S510. While the first audio signal AS1 now has a peak volume level of approximately −6 dB, the second audio signal AS2 now has a peak volume level of approximately −10 dB.

Figure 6E:
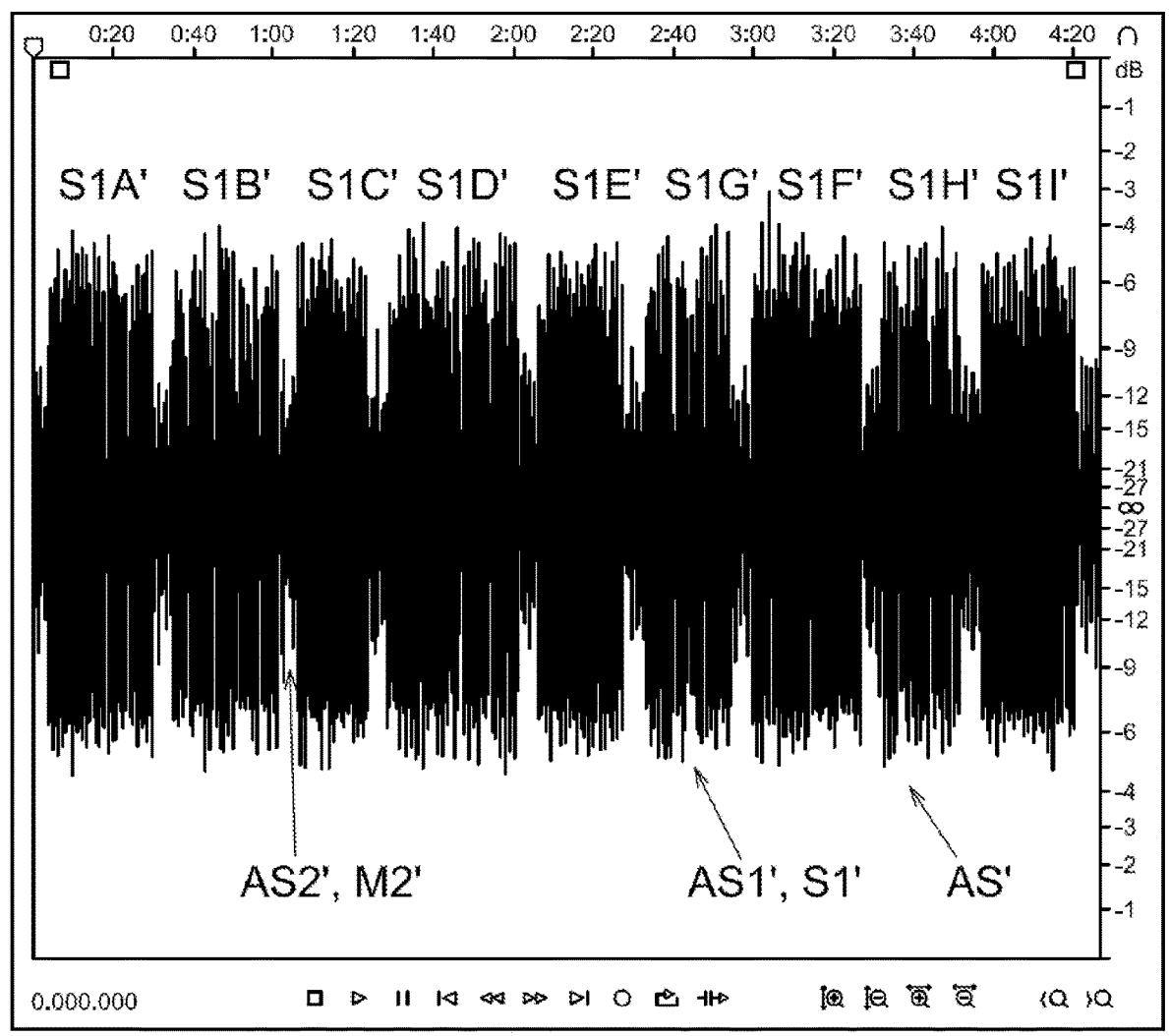

FIG. 6E shows the combined audio signal AS comprising the first audio signal AS1 including speech S1 and the second audio signal AS2, provided by selectively harmonically exciting the combined audio signal AS, as described with reference to S511. While the first audio signal AS1 now has a peak volume level of approximately −4 dB, the second audio signal AS2 now has a peak volume level of approximately −10 dB.

Figure 6F:
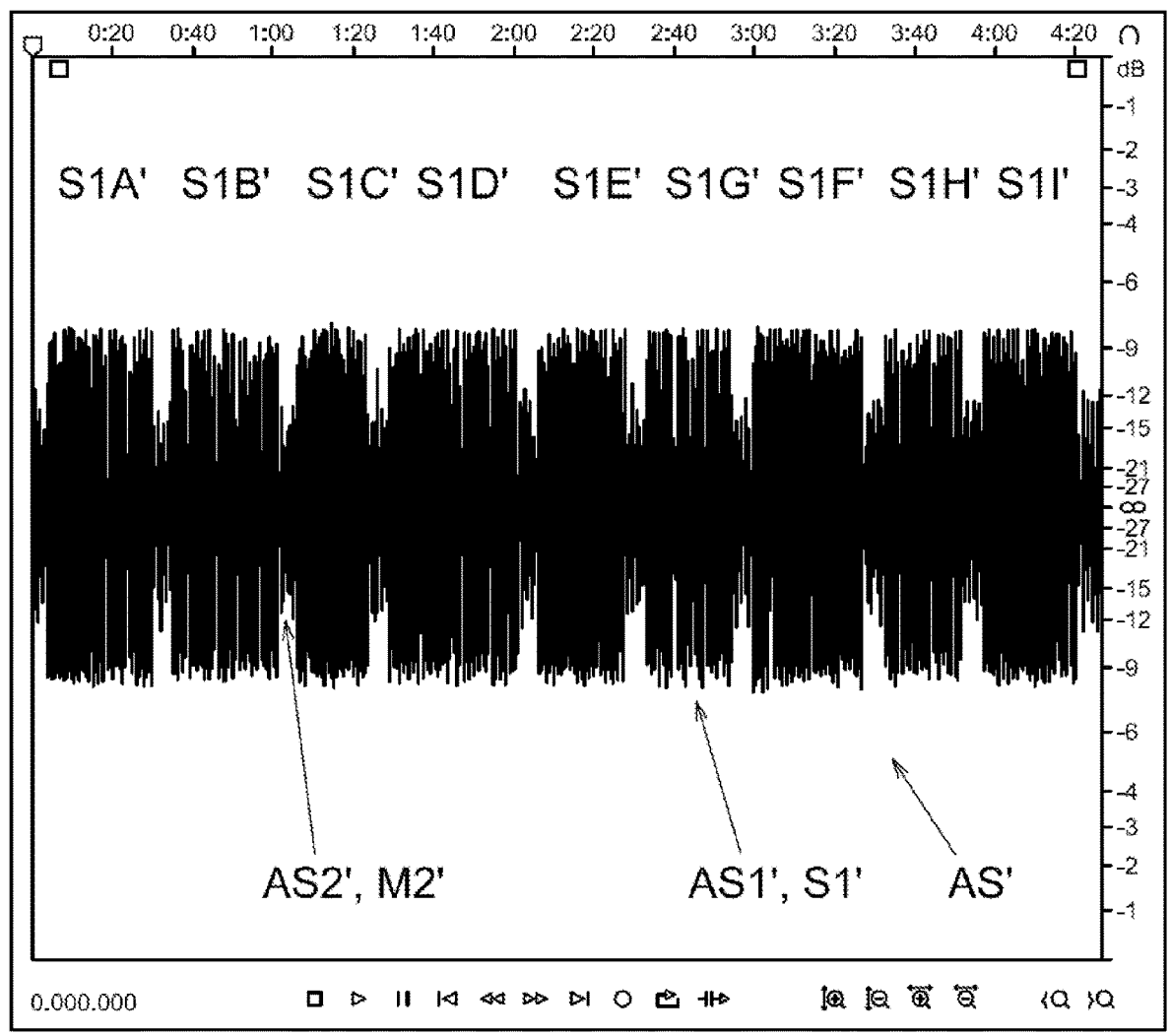

FIG. 6F shows the combined audio signal AS comprising the first audio signal AS1 including speech S1 and the second audio signal AS2, provided by controlling a dynamic range of the combined audio signal AS, as described with reference to S511. While the first audio signal AS1 now has a peak volume level of approximately −8 dB, the second audio signal AS2 now has a peak volume level of approximately −12 dB. In contrast, the combined audio signal AS, as described with reference to S507, comprises the first audio signal AS1, having a peak volume level of about −1 dB, and the second audio signal AS2, having a peak volume level of approximately −27 dB. As described previously with respect to FIG. 1, compared with the received combined audio signal AS, an amplitude of the first audio signal AS1' is generally harmonized and reduced. However, while an amplitude of the second audio signal AS2' is increased between the nine separate processed speech segments S1A' to S1I', an amplitude of the second audio signal AS2' is reduced within the nine separate processed speech segments S1A' to S1I'. In other words, during segments of the processed speech S1', the amplitude of the second audio signal AS2 is reduced and between segments of the processed speech S1', the amplitude of the second audio signal AS2 is increased.

In this way, a quality of the speech included in the output audio signal is improved, as described previously, for example compared with a quality of the speech included in the received first audio signal.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processor circuits. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

Although the example embodiments have been described with reference to the components, modules and units discussed herein, such functional elements may be combined into fewer elements or separated into additional elements. Various combinations of optional features have been described herein, and it will be appreciated that described features may be combined in any suitable combination. In particular, the features of any one example embodiment may be combined with features of any other embodiment, as appropriate, except where such combinations are mutually exclusive. Throughout this specification, the term "comprising" or "comprises" may mean including the component(s) specified but is not intended to exclude the presence of other components.

Although a few example embodiments have been shown and described, it will be appreciated by those skilled in the art that various changes and modifications might be made without departing from the scope of the invention, as defined in the appended claims.

The invention claimed is:

1. A computer device for processing audio signals, the computer device including at least a processor and a memory, wherein the computer device is configured to:
   receive a bitstream comprising a combined audio signal, the combined audio signal comprising a first audio signal including speech and a second audio signal;
   compress the combined audio signal to provide a compressed audio signal by:
   selectively reducing an amplitude of the second audio signal only within speech segments of the speech included in the first audio signal using a tube compressor, selectively increasing an amplitude of the speech included in the first audio signal using a speech compressor, and matching amplitudes of the first audio signal and the second audio signal using a dynamic compressor; and
   control a dynamic range of the compressed audio signal to provide an output audio signal;
   whereby an intelligibility of the speech included in the output audio signal is improved compared with that of the received combined audio signal.

2. The computer device according to claim 1, wherein the computer device is configured to:
   selectively harmonically excite the compressed audio signal.

3. The computer device according to claim 1, wherein the computer device is configured to:
   receive a first bitstream including the first audio signal and a second bitstream including the second audio signal; and
   sum the first bitstream and the second bitstream, thereby providing the combined audio signal.

4. The computer device according to claim 3, wherein the computer device is configured to:
   normalize the first audio signal included in the first bitstream and/or the second audio signal included in the second bitstream.

5. The computer device according to claim 3, wherein the computer device is configured to:
   adjust an amplitude of the second audio signal included in the second bitstream.

6. The computer device according to claim 1, wherein the second audio signal comprises music.

7. The computer device according to claim 1, wherein the computer device is configured to:
   transmit the output audio signal via a telephony service.

8. A method of processing audio signals on a computer device, the method being implemented by hardware of the computer device including at least a processor and a memory, the method comprising:
   receiving a bitstream comprising a combined audio signal, the combined audio signal comprising a first audio signal including speech and a second audio signal;
   compressing the combined audio signal to provide a compressed audio signal, wherein compressing the combined audio signal comprises: selectively reducing an amplitude of the second audio signal only within speech segments of the speech included in the first audio signal using a tube compressor, selectively increasing an amplitude of the speech included in the first audio signal using a speech compressor, and matching amplitudes of the first audio signal and the second audio signal using a dynamic compressor; and
   controlling a dynamic range of the compressed audio signal to provide an output audio signal;
   whereby an intelligibility of the speech included in the output audio signal is improved compared with that of the received combined audio signal.

9. The method according to claim 8, comprising:
selectively harmonically exciting the compressed audio signal.

10. The method according to claim 8, comprising:
receiving a first bitstream including the first audio signal and a second bitstream including the second audio signal; and
summing the first bitstream and the second bitstream, thereby providing the combined audio signal.

11. The method according to claim 10, comprising:
normalizing the first audio signal included in the first bitstream and/or the second audio signal included in the second bitstream.

12. The method according to claim 10, comprising:
adjusting an amplitude of the second audio signal included in the second bitstream.

13. The method according to claim 8, wherein the second audio signal comprises music.

14. The method according to claim 8, comprising:
transmitting the output audio signal via a telephony service.

15. A tangible non-transient computer-readable storage medium having recorded thereon instructions which when implemented by computer device including at least a processor and a memory, cause the computer device to perform a method of processing audio signals on the computer device, the method according to claim 8.

16. The computer device according to claim 1, wherein the computer device is configured to control equalization to thereby selectively reduce amplitudes of signals having strong spectral content within certain frequency ranges.

17. The method according to claim 8, comprising controlling equalization to thereby selectively reduce amplitudes of signals having strong spectral content within certain frequency ranges.

* * * * *